United States Patent
Fukaya

(10) Patent No.: US 10,716,249 B2
(45) Date of Patent: Jul. 14, 2020

(54) COMPONENT MOUNTING MACHINE

(71) Applicant: FUJI CORPORATION, Chiryu-shi (JP)

(72) Inventor: Yoshiyuki Fukaya, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 305 days.

(21) Appl. No.: 15/741,123

(22) PCT Filed: Jul. 28, 2015

(86) PCT No.: PCT/JP2015/071384
§ 371 (c)(1),
(2) Date: Dec. 29, 2017

(87) PCT Pub. No.: WO2017/017788
PCT Pub. Date: Feb. 2, 2017

(65) Prior Publication Data
US 2018/0352691 A1     Dec. 6, 2018

(51) Int. Cl.
*H05K 13/04* (2006.01)
*H05K 13/08* (2006.01)

(52) U.S. Cl.
CPC ..... *H05K 13/0409* (2018.08); *H05K 13/0413* (2013.01); *H05K 13/0812* (2018.08)

(58) Field of Classification Search
CPC ........... H05K 13/0812; H05K 13/0408; H05K 13/0409; Y10T 29/53174; Y10T 29/53191; Y10T 29/53178; Y10T 29/53183
See application file for complete search history.

(56) References Cited

U.S. PATENT DOCUMENTS

| | | | | |
|---|---|---|---|---|
| 5,539,977 A | * | 7/1996 | Kano | H05K 13/0813 29/833 |
| 2004/0177494 A1 | * | 9/2004 | Link | A61B 17/1757 29/743 |

FOREIGN PATENT DOCUMENTS

| | | |
|---|---|---|
| JP | 6-37495 A | 2/1994 |
| JP | 7-131191 A | 5/1995 |
| JP | 2000278000 A * | 10/2000 |
| JP | 2006-310816 A | 11/2006 |
| JP | 2007-123807 A | 5/2007 |

OTHER PUBLICATIONS

International Search Report dated Oct. 20, 2015, in PCT/JP2015/071384 filed Jul. 28, 2015.

* cited by examiner

*Primary Examiner* — Livius R. Cazan
(74) *Attorney, Agent, or Firm* — Oblon, McClelland, Maier & Neustadt, L.L.P.

(57) ABSTRACT

A component mounting machine is provided with a suction nozzle including a nozzle suction surface, a camera acquiring nozzle imaged data of a tip end of the suction nozzle, and a control device determining the quality of a nozzle suction surface.

5 Claims, 11 Drawing Sheets

COMPONENT MOUNTING MACHINE

TECHNICAL FIELD

The technology disclosed in the present description relates to a component mounting machine that mounts a component on a board.

BACKGROUND ART

PTL 1 (JP-A-2007-123807) discloses a component transfer device that suctions and transfers an electronic component. The component transfer device is provided with a suction nozzle that suctions the electronic component, a side image capturing camera, an image memory, and an arithmetic means. The side image capturing camera images a single suction nozzle to which an electronic component is not suctioned and a suction nozzle in an electronic component suction state. The image memory stores image data of a single electronic component in which an electronic component is imaged from a lateral side, and image data of a single suction nozzle in which a suction nozzle to which an electronic component is not suctioned is imaged from a lateral side. The arithmetic means generates difference image data from a difference between image data of a suction nozzle in an electronic component suction state and image data of a single suction nozzle. The arithmetic means executes quality determination of a suction surface of a suction nozzle by comparing difference image data and image data of a single electronic component.

SUMMARY

In the component transfer device of PTL 1, the quality of the suction surface of a suction nozzle is determined using image data of a suction nozzle in an electronic component suction state, image data of a single suction nozzle, and image data of a single electronic component. Therefore, it is necessary to store image data of a suction nozzle in an electronic component suction state and image data of a single suction nozzle in advance in the image memory. As a result of this, there is a problem in that the capacity of image data stored in the component transfer device in advance is large.

The component mounting machine disclosed in the present description mounts a component on a board. A component mounting machine is provided with a suction nozzle that includes a nozzle suction surface to which a component is suctioned, a camera that is disposed on a lateral side of the suction nozzle and acquires nozzle imaged data of a tip end of the suction nozzle, and a control device that determines the quality of a suction surface of the suction nozzle. The nozzle imaged data includes a nozzle region in which an image of the tip end of the suction nozzle is captured, and a background region in which an image of a background below the tip end of the suction nozzle is captured. The control device executes, on the nozzle imaged data, a lowermost end position calculation process of scanning a plurality of first inspection lines in a vertical direction or a horizontal direction of the nozzle imaged data, and calculating a lowermost end position of the nozzle suction surface or foreign matter adhered to the nozzle suction surface from a plurality of items of positional information obtained by sensing the nozzle suction surface or foreign matter adhered to the nozzle suction surface by using the plurality of first inspection lines, a difference calculation process of calculating, on the basis of the plurality of items of positional information, a first height, which is a position in the vertical direction of the nozzle suction surface or foreign matter adhered to the nozzle suction surface at a first position that is separated from the lowermost end position by a first set distance or more on one side in the horizontal direction, and a second height, which is a position in the vertical direction of the nozzle suction surface or foreign matter adhered to the nozzle suction surface at a second position that is separated from the lowermost end position by a second set distance or more on the other side in the horizontal direction, and calculating a first difference between the first height and a height of the lowermost end position and a second difference between the second height and the height of the lowermost end position, and a determination process of determining the quality of the nozzle suction surface on the basis of the smaller difference of the first difference and the second difference that are calculated in the difference calculation process.

In the component mounting machine, the control device determines the quality of the nozzle suction surface using only nozzle imaged data that is obtained by capturing an image of the tip end of the suction nozzle. Therefore, it is not necessary for the component mounting machine to store image data to be compared with the nozzle imaged data. As a result of this, it is possible to decrease the capacity of image data that is stored in the component mounting machine in advance.

DESCRIPTION OF EMBODIMENTS

Figure 1:
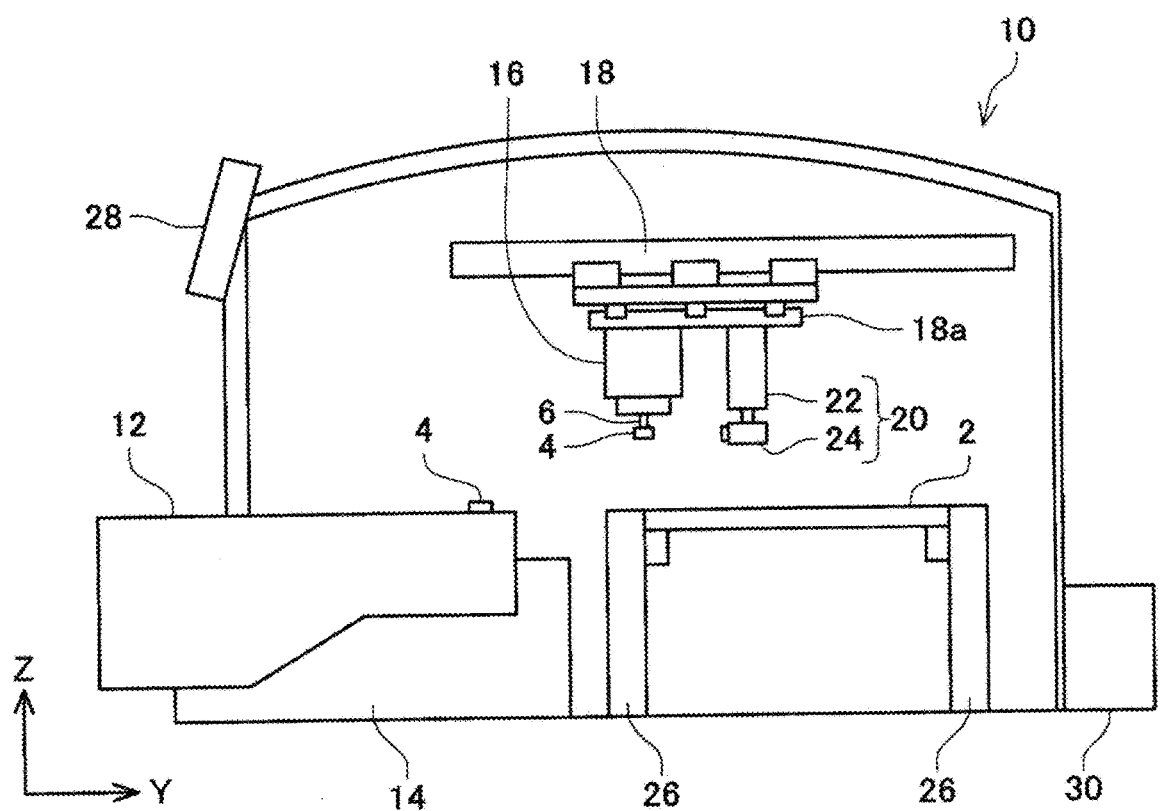
FIG. 1 is a side view that schematically represents a configuration of a component mounting machine.

The main features of the embodiment to be described hereinafter are listed below. Additionally, the respective technical elements described hereinafter are independent technical elements, exhibit technological effectiveness either individually or in various combinations, and are not limited to the combinations that were set forth in the claims at the time of filing.

(Feature 1) In the determination process, the control device may determine that there is an abnormality of the nozzle suction surface in a case in which the smaller difference is a first set value, which is set in advance, or more. When such a configuration is used, it is possible to suitably determine that there is an abnormality of the nozzle suction surface on the basis of the first set value.

(Feature 2) The control device may be configured to execute the determination process using only the first difference and the second difference. When such a configuration is used, it is possible to shorten the time required for determination in comparison with a case in which the determination process is executed also using differences other than the first difference and the second difference.

(Feature 3) The first set distance and the second set distance may be the same, and in the nozzle imaged data in which the suction nozzle is imaged in a normal state, when a length of the nozzle suction surface in the horizontal direction is defined as a reference length, the first set distance and the second set distance are set to behalf or less of the reference length. When such a configuration is used, at least one of the first height and the second height can be used to calculate the height of the nozzle suction surface. Therefore, it is possible to suitably determine the quality of the nozzle suction surface.

(Feature 4) The control device may include a memory section that stores multiple heights of the lowermost end positions. The control device may stores a calculated height of the lowermost end position in the memory section each time the lowermost end position calculation process is performed, and in a case in which it is determined in the determination process that there is an abnormality of the nozzle suction surface, the control device may be configured to further determine that the abnormality of the nozzle suction surface is the adherence of foreign matter to the nozzle suction surface when a third difference between a height of the lowermost end position that is calculated in a current lowermost end position calculation process and a height of the lowermost end position that is calculated in an immediately preceding lowermost end position calculation process, which is stored in the memory section, is a second set value, which is set in advance, or more, and determine that the abnormality of the nozzle suction surface is chipping of the nozzle suction surface when the third difference is less than the second set value. When such a configuration is used, it is possible for the control device to suitably determine whether or not the abnormality of the nozzle suction surface is the adherence of foreign matter to the nozzle suction surface or chipping of the nozzle suction surface.

(Feature 5) The component mounting machine may be further provided with a head that supports the suction nozzle and moves with the suction nozzle in an integral manner. The control device may include multiple control circuits, one of the multiple control circuits may be mounted in the head, and the control device may be configured to execute the lowermost end position calculation process, the difference calculation process, and the determination process by using the control circuit mounted in the head. When such a configuration is used, during determination of the quality of the nozzle suction surface by the control circuit mounted in the head, it is possible to execute other processes by using the control circuits mounted in positions other than the head.

First Embodiment

Figure 2:
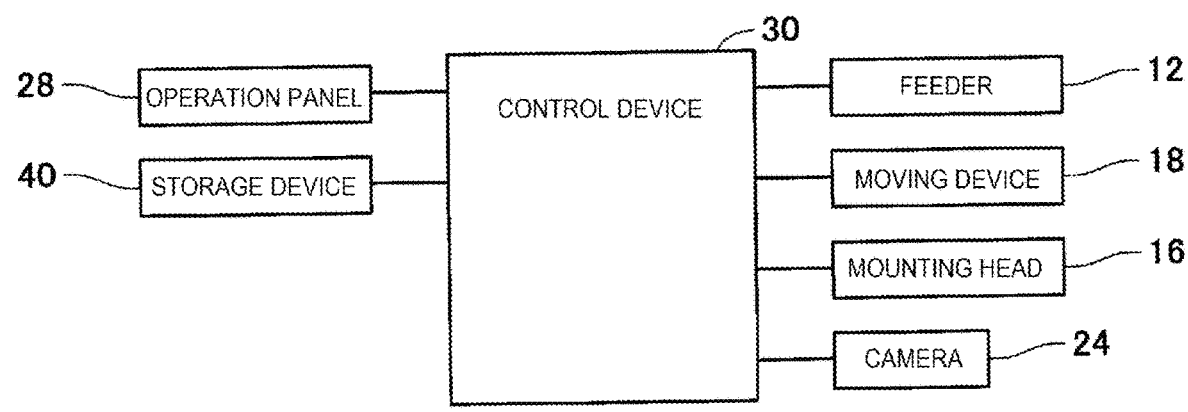
FIG. 2 is a block diagram that represents a configuration of a control system of the component mounting machine.
Figure 3:
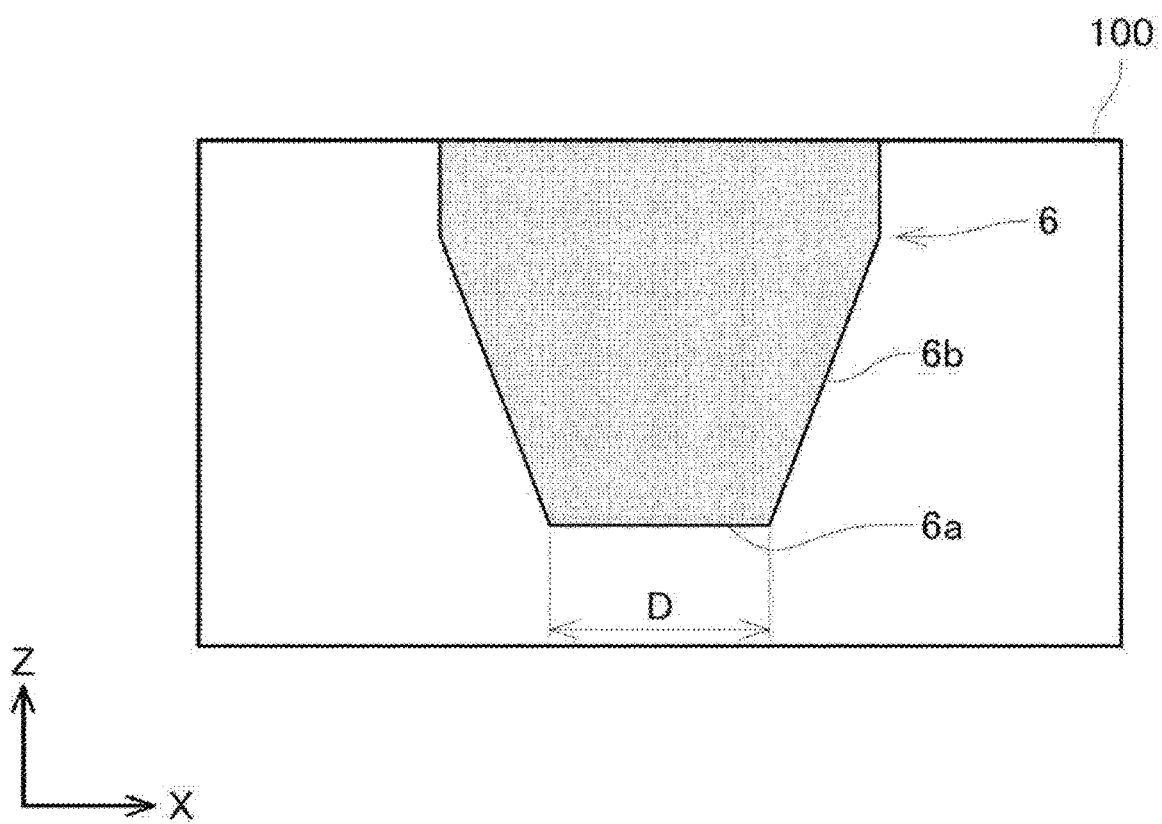
FIG. 3 is nozzle imaged data of a normal suction nozzle.
Figure 4:
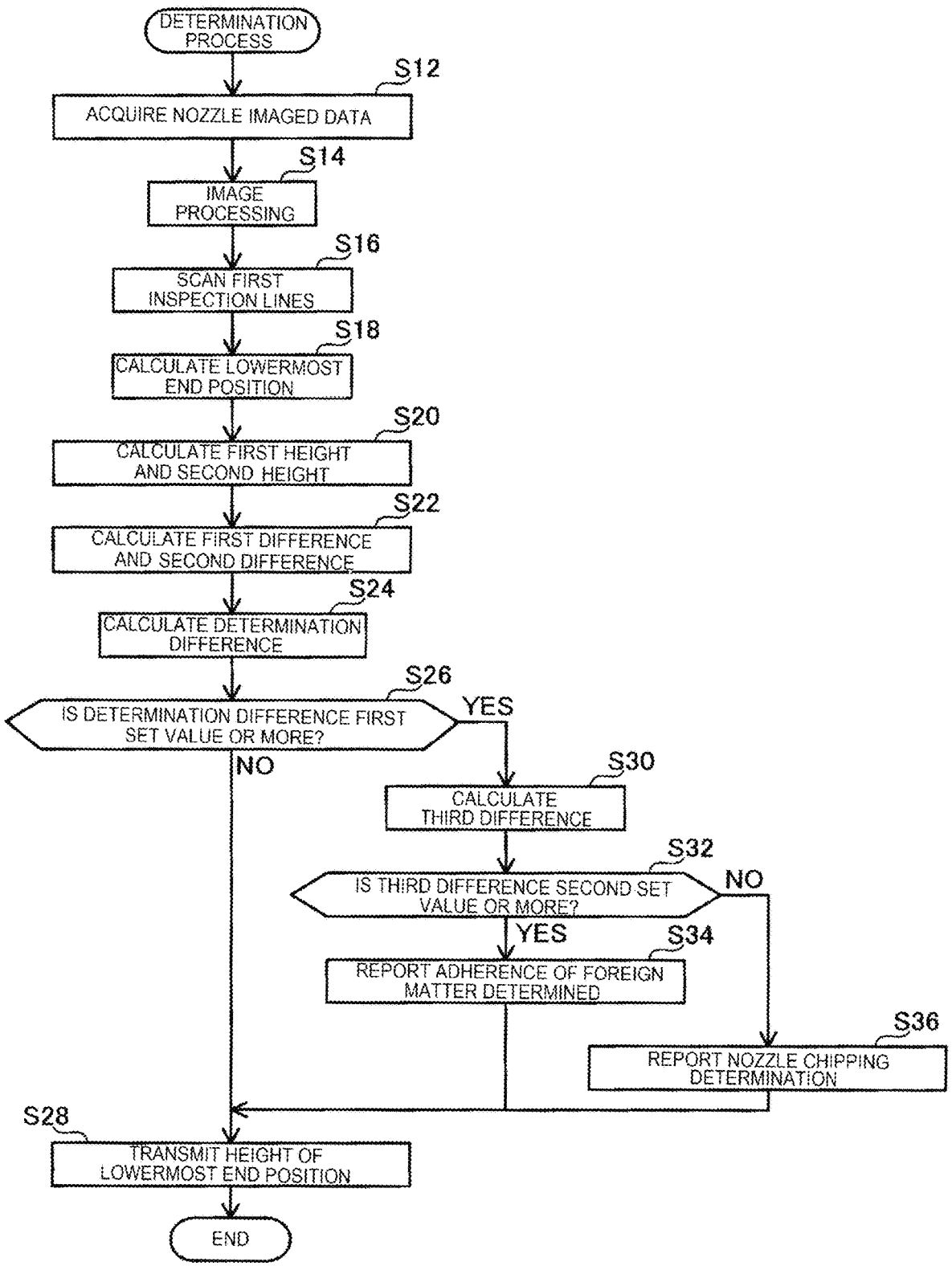
FIG. 4 is a flowchart that shows a sequence of a determination process.

Hereinafter, a component mounting machine 10 according to the present embodiment will be described using FIGS. 1 to 3. The component mounting machine 10 is a device that mounts an electronic component 4 on a circuit board 2. The component mounting machine 10 is also referred to as a surface mounting machine or a chip mounter. Normally, the component mounting machine 10 is installed together with a solder printing machine, other component mounting machines, and a board inspection machine, and configures a series of mounting lines.

As shown in FIG. 1, the component mounting machine 10 is provided with multiple component feeders 12, a feeder holding section 14, a mounting head 16, an imaging unit 20, a moving device 18 that causes the mounting head 16 and the imaging unit 20 to move, aboard conveyor 26, an operation panel 28, and a control device 30.

Each component feeder 12 accommodates multiple electronic components 4. The component feeders 12 are attached to the feeder holding section 14 in an attachable and detachable manner, and supply the electronic components 4 to the mounting head 16. The specific configuration of the component feeders 12 is not particularly limited. For example, each component feeder 12 may be a tape-type feeder that accommodates the multiple electronic components 4 on a wound tape, a tray-type feeder that accommodates the multiple electronic components 4 on a tray, or a bulk-type feeder that accommodates the multiple electronic components 4 inside a container randomly.

The moving device 18 is an example of a moving device that causes the mounting head 16 and the imaging unit 20 to move between the component feeder 12 and the circuit board 2. The moving device 18 of the present embodiment is an XY-robot that causes a movement base 18a to move in an X-direction and a Y-direction. The moving device 18 is configured by a guide rail that guides the movement base 18a, a moving mechanism that causes the movement base 18a to move along the guide rail, a motor that drives the moving mechanism, and the like. The moving device 18 is disposed above the component feeder 12 and the circuit board 2. The mounting head 16 and the imaging unit 20 are attached to the movement base 18a. The mounting head 16 and the imaging unit 20 move above the component feeder 12 and above the circuit board 2 by using the moving device 18.

The mounting head 16 is provided with a suction nozzle 6 that suctions the electronic component 4. The suction nozzle 6 is configured to be attachable and detachable to the mounting head 16. The suction nozzle 6 is attached to the mounting head 16 so as to be capable of moving in a Z-direction (the up-down direction in the drawing). The suction nozzle 6 is provided with a nozzle suction surface 6a to which the electronic component 4 is suctioned, and a nozzle side surface 6b that narrows toward the tip end of the suction nozzle 6. The suction nozzle 6 ascends and descends in the up-down direction due to an actuator (not illustrated) that is accommodated in the mounting head 16, and is configured to be capable of suctioning the electronic component 4. In order to mount the electronic component 4 on the circuit board 2 by using the mounting head 16, firstly, the suction nozzle 6 is caused to move downward until the nozzle suction surface 6a of the suction nozzle 6 abuts against the electronic component 4 accommodated in the component feeder 12. Next, the electronic component 4 is suctioned to the suction nozzle 6, and the suction nozzle 6 is caused to move upward. Next, the mounting head 16 is positioned relative to the circuit board 2 by the moving device 18. Next, the electronic component 4 is mounted on the circuit board 2 as a result of the suction nozzle 6 being caused to descend toward the circuit board 2. In the present embodiment, the above-mentioned operation by the mounting head 16 is referred to as a mounting process.

The imaging unit 20 is attached to the movement base 18a. Therefore, when the mounting head 16 moves, the imaging unit 20 also moves in an integral manner. The imaging unit 20 is provided with a camera support section 22 and a camera 24. The camera support section 22 is attached to the movement base 18a. The camera 24 is attached to the camera support section 22. The camera 24 is disposed on the lateral side (the Y-direction in the drawing) of the suction nozzle 6. Additionally, it is possible to adjust a region of the suction nozzle 6 that is included in an imaging region of the camera 24 as a result of the suction nozzle 6 ascending and descending in the up-down direction due to the mounting head 16.

The board conveyor 26 is a device that performs carry-in into the component mounting machine 10, positioning on the component mounting machine 10, and carry-out from the component mounting machine 10 of the circuit board 2. For example, the board conveyor 26 of the present embodiment can be configured by a pair of belt conveyors, a supporting device (not illustrated) that is attached to the belt conveyors and supports the circuit board 2 from below, and a driving device that drives the belt conveyors. The operation panel 28 is an input device that receives an instruction of an operator and a display device that displays various information to a worker.

The control device 30 is configured using a computer provided with a CPU, a ROM, and a RAM. As shown in FIG. 2, the component feeder 12, the mounting head 16, the moving device 18, the camera 24, and the operation panel 28 is connected to the control device 30 in a communicable manner. The control device 30 performs mounting of the electronic component 4 on the circuit board 2 by controlling each of the above-mentioned sections (12, 16, 18, 24, 28, and the like).

A storage device 40 is connected to the control device in a communicable manner. An operation program for controlling operation of the component mounting machine 10, a first set distance $L_1$ and a second set distance $L_2$ that are calculated by a set distance calculation process, which will be mentioned later, and positional information $p_L$ ($x_L$, $z_L$) of a lowermost end position $p_L$ that is calculated by a determination process, which will be mentioned later, are stored in the storage device 40. The control device 30 executes the mounting process of mounting the electronic component 4 on the circuit board 2, the set distance calculation process of calculating the set distances $L_1$ and $L_2$, and the determination process of determining the quality of the nozzle suction surface 6a by executing the operation program.

The set distance calculation process that the control device 30 executes will be described below using FIG. 3. The set distance calculation process is a process that is only executed immediately after the suction nozzle 6 is replaced. Furthermore, in addition to immediately after the suction nozzle 6 is replaced, the set distance calculation process may be set so as to be executed each time mounting of an electronic component 4 on a circuit board 2 is executed a predetermined number of times.

Firstly, the control device 30 acquires nozzle imaged data 100 (that is, captured image data of the suction nozzle 6 in state in which an electronic component 4 is not suctioned) immediately after the suction nozzle 6 is replaced. Next, the control device 30 executes an image processing on the nozzle imaged data 100. More specifically, firstly, the control device 30 executes a binarization process on the nozzle imaged data 100. The binarization process on the nozzle imaged data 100 is executed using a publicly-known method. Additionally, a threshold value of a luminance value during performance of the binarization process is set to a value at which it is possible to distinguish between a background region and regions (for example, the suction nozzle 6, foreign matter 110, and the like) other than the background region. As a result of this, the control device 30 can clearly distinguish between the suction nozzle 6 and the foreign matter 110, and the background region in the nozzle imaged data 100 (FIG. 3). Next, the control device 30 calculates the length (a reference length D) in the horizontal direction of the nozzle suction surface 6a in the nozzle imaged data 100 using the nozzle imaged data 100. Next, the control device 30 determines the first set distance $L_1$ and the second set distance $L_2$ on the basis of the reference length D. More specifically, the control device 30 determines a numerical value that is half or less of the reference length D as the first set distance $L_1$ and the second set distance $L_2$. At this time, the control device 30 determines the first set distance $L_1$ and the second set distance $L_2$ in consideration of a resolution of the camera 24. That is, even if the resolution of the camera 24 is taken into consideration, a value obtained by adding the first set distance $L_1$ and the second set distance $L_2$ is set so as to be shorter than the reference length D in the horizontal direction of the nozzle suction surface 6a. Next, the control device 30 stores the first set distance $L_1$ and the second set distance $L_2$ in the storage device 40. Additionally, in the first embodiment, the first set distance $L_1$ and the second set distance $L_2$ are set to be 2 times the distance of an interval S of first inspection lines $C_1$ to $C_{20}$, which will be mentioned later. That is, the distances of the first set distance $L_1$ and the second set distance $L_2$ are the same.

The determination process that the control device 30 executes will be described below using FIGS. 4 to 8. The determination process is a process that is executed each time mounting of an electronic component 4 on a circuit board 2 is completed. Therefore, it is preferable that the determination process be completed during a period in which the mounting head 16 moves above the component feeder 12 from above the circuit board 2. Additionally, in the determination process of the first embodiment, the number of first inspection lines C is 20.

Figure 5:
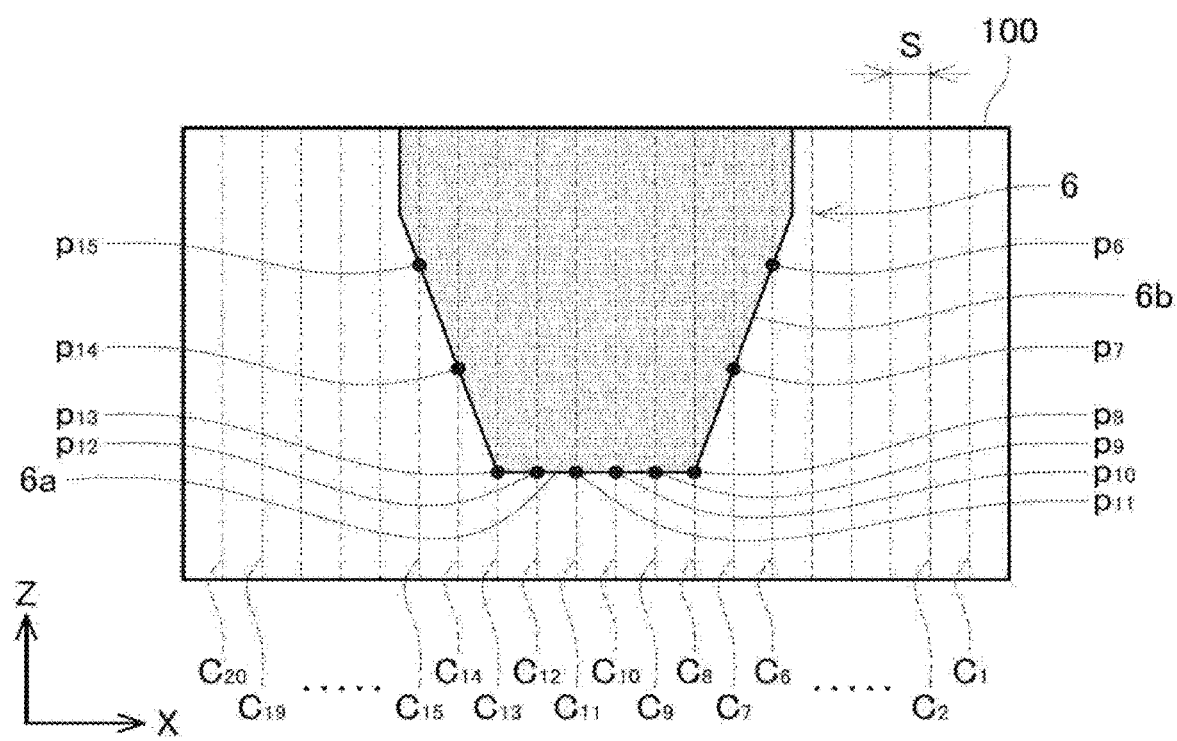
FIG. 5 is a view that shows a state in which multiple first inspection lines that extend in a vertical direction are set, at an interval in the horizontal direction, in the nozzle imaged data of a normal suction nozzle.
Figure 6:
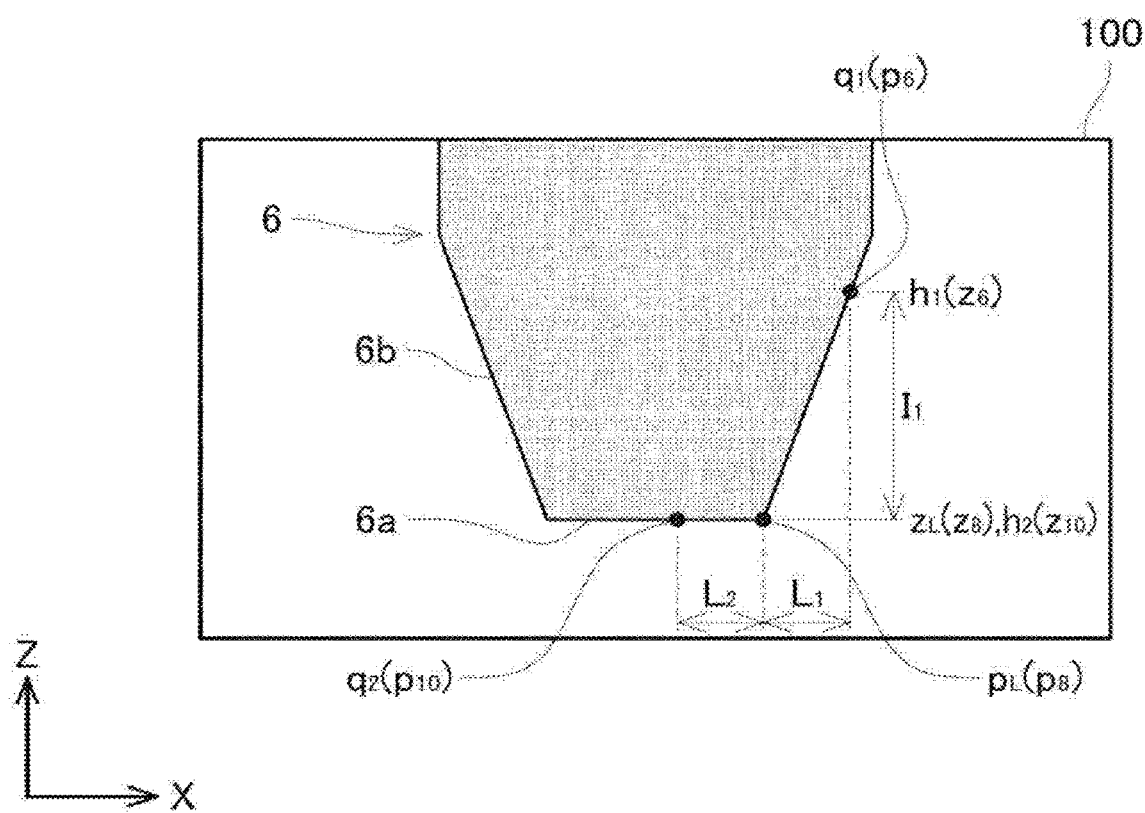
FIG. 6 is nozzle imaged data of a normal suction nozzle.

Firstly, in Step S12 the control device 30 operates the camera 24, and images the nozzle imaged data 100 of the suction nozzle 6. Next, in Step S14, the control device 30 executes an image processing on the nozzle imaged data 100 that is imaged in Step S12. In the image process, the same process (that is, a binarization process) as the image processing that is executed by the set distance calculation process is executed. Next, in Step S16, the control device 30 scans the nozzle imaged data 100 for each of the multiple first inspection lines $C_1$ to $C_{20}$ that are set in advance, and determines whether or not there is an object on the inspection lines. As shown in FIG. 5, the first inspection lines $C_1$ to $C_{20}$ are set in the nozzle imaged data 100 in advance. The first inspection lines $C_1$ to $C_{20}$ extend in a vertical direction and are disposed at a constant interval in the horizontal direction. The control device 30 scans in the Z-direction (the vertical direction) for each of the first inspection lines $C_1$ to $C_{20}$ and determines whether or not there is a background image from the luminance of points on each first inspection line. That is, it is determined whether or not the suction nozzle 6 or the foreign matter 110 is present on each point on the first inspection lines $C_1$ to $C_{20}$.

Next, in Step S18, the control device 30 calculates the lowermost end position $p_L$ of the suction nozzle 6 or foreign matter 110 that is adhered to the nozzle suction surface 6a. More specifically, firstly, the control device 30 calculates positional information $p_n(x_n, z_n)$ of a sensed lowest point of the suction nozzle 6 or the foreign matter 110 for each of multiple first inspection lines $C_n$ on which the suction nozzle 6 or the foreign matter 110 adhered to the nozzle suction surface 6a are detected. Next, among the positional information $p_n(x_n, z_n)$ of the multiple first inspection lines $C_n$, the control device 30 determines positional information $p_n$ for which height information $z_n$ is the smallest as positional information $p_L(x_L, z_L)$ of the lowermost end position $p_L$. Additionally, in a case in which there is multiple items of smallest height information $z_n$, the control device 30 calculates the positional information $p_n$ furthest on the positive direction side in the X-direction as the positional information $p_L(x_L, z_L)$ of the lowermost end position $p_L$. For example, in the case of FIG. 5, height information $z_8$ to $z_{13}$ of positional information $p_8$ to $p_{13}$ is the lowest. In this case, the control device 30 calculates positional information $p_8(x_8, z_8)$ as the lowermost end position $p_L(x_L, z_L)$.

Next, in Step S20, the control device 30 calculates a first height $h_1$ and a second height $h_2$. The first height $h_1$ is height information of a first position $q_1$, which is a lowest point at which a scanning line senses the suction nozzle 6 or the foreign matter 110 adhered to the nozzle suction surface 6a when scanning lines that extend in the vertical direction are scanned, at a position that is separated from the lowermost end position $p_L$ by the first set distance $L_1$ on the positive direction side in the X-direction. The second height $h_2$ is height information of a second position $q_2$, which is a lowest point at which a scanning line senses the suction nozzle 6 or the foreign matter 110 adhered to the nozzle suction surface 6a when scanning lines that extend in the vertical direction are scanned, at a position that is separated from the lowermost end position $p_L$ by the second set distance $L_2$ on the negative direction side in the X-direction. In the first embodiment, distances that are 2 times the interval S of adjacent first inspection lines $C_n$ to $C_{n+1}$ are set as the first set distance $L_1$ and the second set distance $L_2$. When such a configuration is used, it is possible to calculate the first height $h_1$ and the second height $h_2$ using the multiple items of positional information $p_n(x_n, z_n)$ calculated in Step S18. For example, in the case of FIG. 6, the first height $h_1$ is calculated from height information $z_6$ of a position $p_6$, and the second height $h_2$ is calculated from height information $z_{10}$ of a position $p_{10}$). As a result of this, it is possible to shorten the time required for calculating the first height $h_1$ and the second height $h_2$. In addition, since the first set distance $L_1$ and the second set distance $L_2$ are set to be half or less of the reference length D, at least one of the first height $h_1$ and the second height $h_2$ can sense the nozzle suction surface 6a or foreign matter 110 adhered to the nozzle suction surface 6a.

Figure 8:
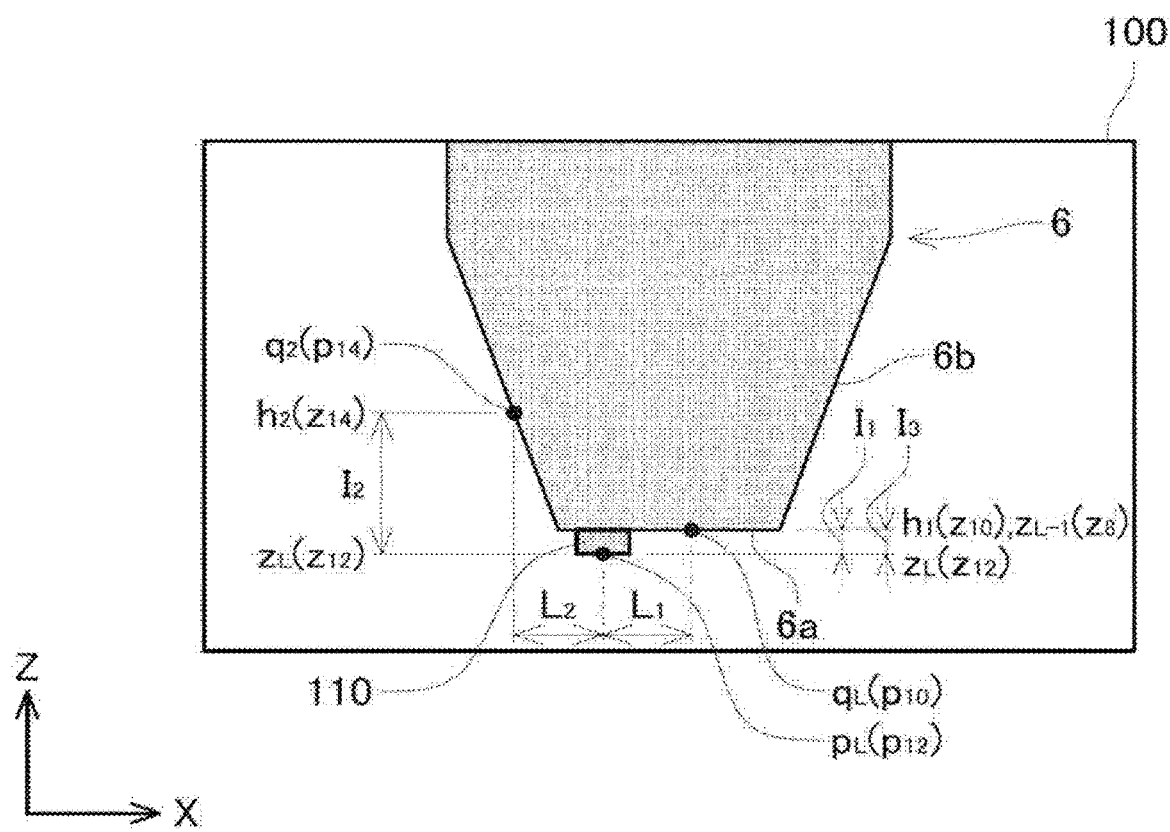
FIG. 8 is nozzle imaged data of a case in which foreign matter is adhered to the nozzle suction surface of the suction nozzle.

Next, in Step S22, the control device 30 calculates a first difference $I_1$ and a second difference $I_2$. The first difference $I_1$ is a difference between height information $z_L$ of the lowermost end position $p_L$ and the first height $h_1$ of the first position $q_1$, and the second difference $I_2$ is a difference between the height information $z_L$ of the lowermost end position $p_L$ and the second height $h_2$ of the second position $q_2$ (FIG. 8). Next, in Step S24, the control device 30 determines the smaller difference of the first difference $I_1$ and the second difference $I_2$ as a determination difference I.

Next, in Step S26, the control device 30 determines whether or not the determination difference I is the first set value or more. In a case in which the determination difference I is the first set value or more (YES in Step S26), the control device 30 advances the process to Step S30. The first set value is set as a value obtained in consideration of the size of the foreign matter 110 that it is desirable to detect or the size of chipping of the nozzle that it is desirable to detect. As a result of this, it is possible to determine whether or not an abnormality has occurred in the nozzle suction surface 6a of the suction nozzle 6 by determining whether or not the determination difference I is the first set value or more. Meanwhile, in a case in which the determination difference I is less than the first set value (NO in Step S26), the control device 30 determines that the nozzle suction surface 6a of the suction nozzle 6 is normal, and advances the process to Step S28. In Step S28, the control device 30 stores the positional information $p_L(x_L, z_L)$ of the lowermost end position $p_L$ that was calculated on this occasion in the storage device 40, and ends the determination process.

Next, in Step S30, the control device 30 calculates a third difference $I_3$, which is a difference between the height information $z_L$ of the lowermost end position $p_L$ calculated on this occasion and height information $z_{L-1}$ of a lowermost end position $p_{L-1}$ calculated in a previous determination process, which is stored in the storage device 40. Additionally, the third difference $I_3$ is calculated by using the expression $z_{L-1} - z_L$.

Next, in Step S32, the control device 30 determines whether or not the third difference $I_3$ is a second set value or more. In a case in which the third difference $I_3$ is the second set value or more (YES in Step S32), the control device 30 advances the process to Step S34. As shown in FIG. 8, in a case in which the foreign matter 110 is adhered to the nozzle suction surface 6a, the lowermost end position $p_L$ of the nozzle imaged data 100 is lower. In this case, the third difference $I_3$ is a positive value. It is possible to determine whether or not the foreign matter 110 is adhered to the nozzle suction surface 6a by determining whether or not the third difference $I_3$ is the second set value or more. Next, in Step S34, the control device 30 reports that it has been determined that the foreign matter 110 is adhered to the nozzle suction surface 6a. For example, as a method of reporting, nozzle chipping determination or the like may be displayed on the operation panel 28. As a result of this, an operator can instruct the component mounting machine 10 to clean the nozzle suction surface 6a, or the like. Meanwhile, in a case in which the third difference $I_3$ is less than the second set value (NO in Step S32), the control device 30 advances the process to Step S36. In Step S36, the control device 30 reports that it has been determined that there is chipping of the nozzle suction surface 6a of the suction nozzle 6. For example, as a method of reporting, nozzle chipping determination or the like may be displayed on the operation panel 28. As a result of this, an operator can instruct the component mounting machine 10 to replace the suction nozzle 6, or the like.

(Case A) A specific Case A in which it is possible to determine that there is an abnormality by using the determination process of the first embodiment will be described using FIGS. 7 and 8. The foreign matter 110 is adhered to the nozzle suction surface 6a of the suction nozzle 6 of Case A. Additionally, the immediately preceding determination process was executed with the nozzle suction surface 6a in a normal state (the state of FIG. 6). Therefore, positional information $p_8(x_8, z_8)$ is stored in the storage device 40 as the positional information $p_L(x_L, z_L)$ of the lowermost end position $p_L$.

Figure 7:
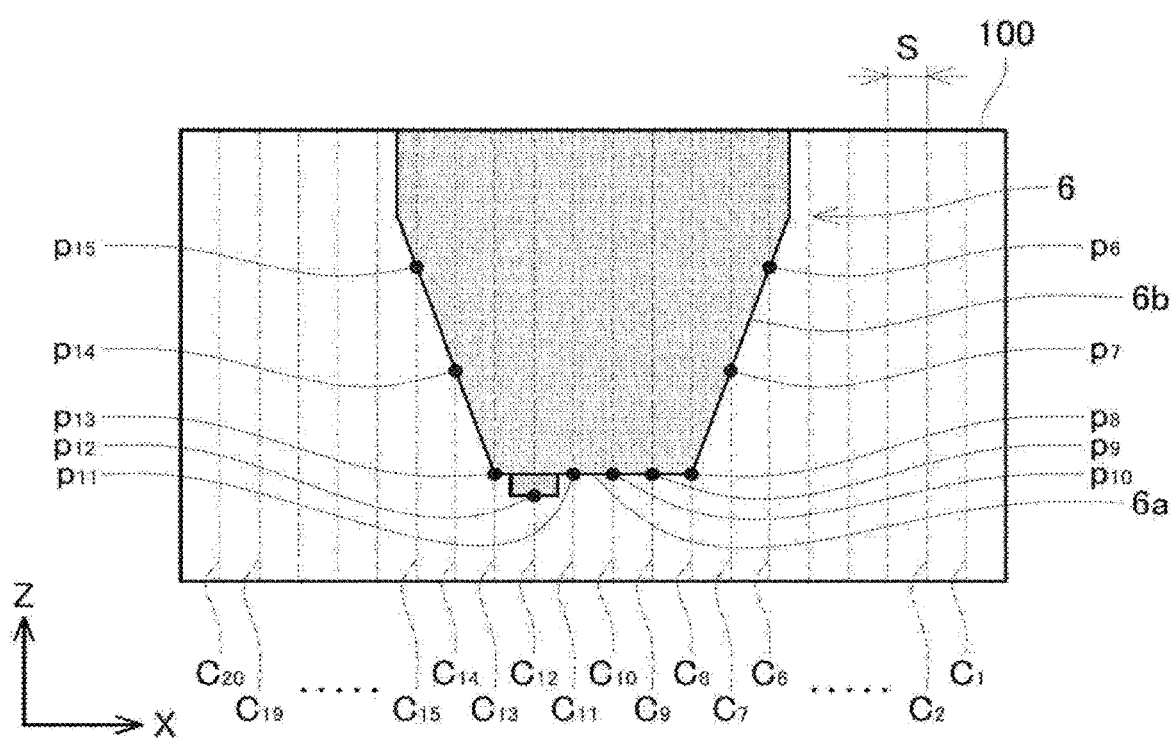
FIG. 7 is a view that shows a state in which multiple first inspection lines that extend in the vertical direction are set, at an interval in the horizontal direction, in nozzle imaged data of a case in which foreign matter is adhered to the nozzle suction surface of the suction nozzle.

In the case of FIG. 7, in Step S18, the control device 30 calculates the positional information $p_{12}$ ($x_{12}$, $z_{12}$) of the first inspection line $C_{12}$ that senses the lower face of the foreign matter 110 as the positional information $p_L$ ($x_L$, $z_L$) of the lowermost end position $p_L$. Next, in Step S20, the control device 30 calculates a first height $h_1$ and a second height $h_2$. In the above-mentioned manner, distances that are 2 times the interval S are set as the first set distance $L_1$ and the second set distance $L_2$. Therefore, the first height $h_1$ is calculated using height information $z_{10}$ of a positional information $p_{10}$, and the second height $h_2$ is calculated using height information $z_{14}$ of a positional information $p_{14}$. Next, in Step S22, the control device 30 calculates the first difference $I_1$ and the second difference $I_2$.

Next, in Step S24, the control device 30 sets the first difference $I_1$, which is the smaller of the first difference $I_1$ and the second difference $I_2$, as the determination difference I. In this case, the determination difference I corresponds to the height of the foreign matter 110 that is adhered to the nozzle suction surface 6a of the suction nozzle 6. The first height $h_1$ is the height information $z_{10}$ of the positional information $p_{10}$ at which the nozzle suction surface 6a is positioned, and the second height $h_2$ is the height information $z_{14}$ of the positional information $p_{14}$ at which the nozzle side surface 6b is positioned. The nozzle side surface 6b is positioned above the nozzle suction surface 6a. Therefore, it is possible to suitably calculate the height of the foreign matter 110 by setting the first difference $I_1$ as the determination difference I.

Next, in Step S26, the control device 30 determines that the determination difference I is the first set value or more, and advances the process to Step S30. A value at which it is possible to detect the foreign matter 110 is set as the first set value. Next, in Step S30, the control device 30 calculates the third difference $I_3$, which is the difference between the height information $z_L$ of the lowermost end position $p_L$ calculated on this occasion and the height information $z_{L-1}$ of the lowermost end position $p_{L-1}$ calculated in a previous determination process. In the case of FIG. 8, the third difference $I_3$ is a positive value. Next, in Step S32, the control device 30 determines that the third difference $I_3$ is the second set value or more, and advances the process to Step S34. Next, in Step S34, the control device 30 transmits a foreign matter suction determination signal to the operation panel 28. As a result of this, it is possible for an operator to recognize that the foreign matter 110 is adhered to the nozzle suction surface 6a.

(Case B) Another specific Case B in which it is possible to determine that there is an abnormality by using the determination process of the first embodiment will be described using FIGS. 9 and 10. In the suction nozzle 6 of Case B, a portion of the nozzle suction surface 6a is chipped. Additionally, the immediately preceding determination process was executed with the nozzle suction surface 6a in a normal state (the state of FIG. 6). Therefore, positional information $p_8$ ($x_8$, $z_8$) is stored in the storage device 40 as the positional information $p_L$ ($x_L$, $z_L$) of the lowermost end position $p_L$.

Figure 9:
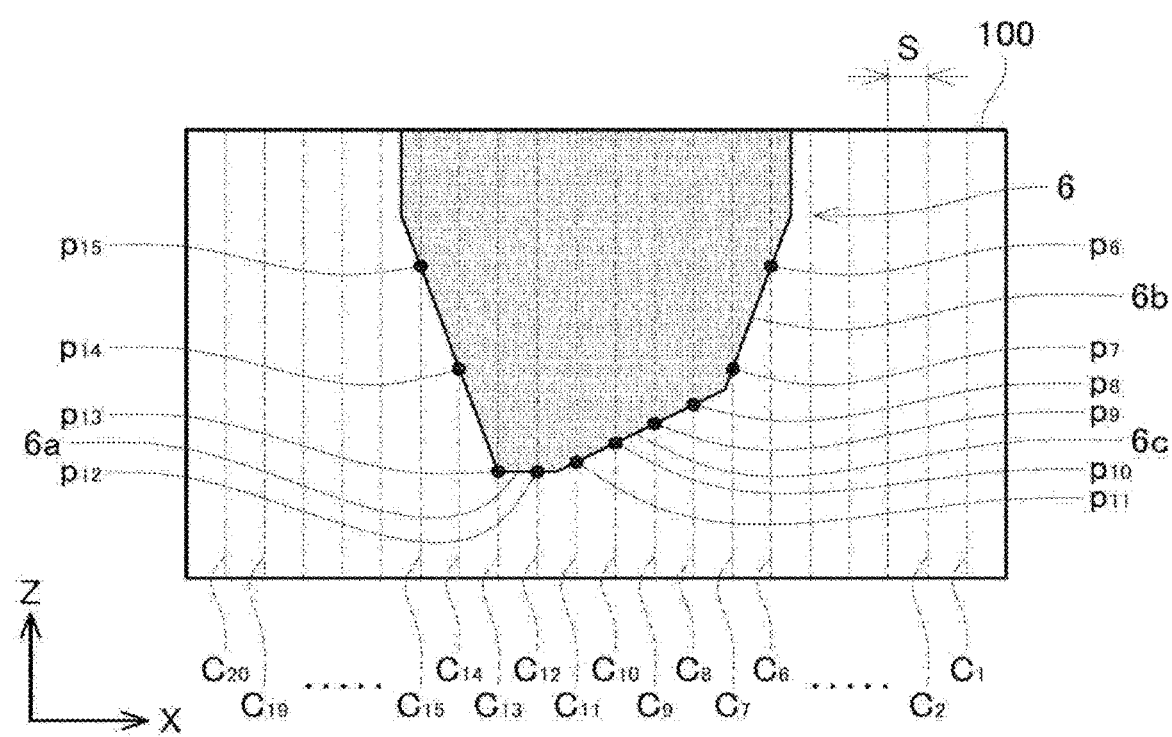
FIG. 9 is a view that shows a state in which multiple first inspection lines that extend in the vertical direction are set, at an interval in the horizontal direction, in nozzle imaged data of a case in which the nozzle suction surface of the suction nozzle is chipped.
Figure 10:
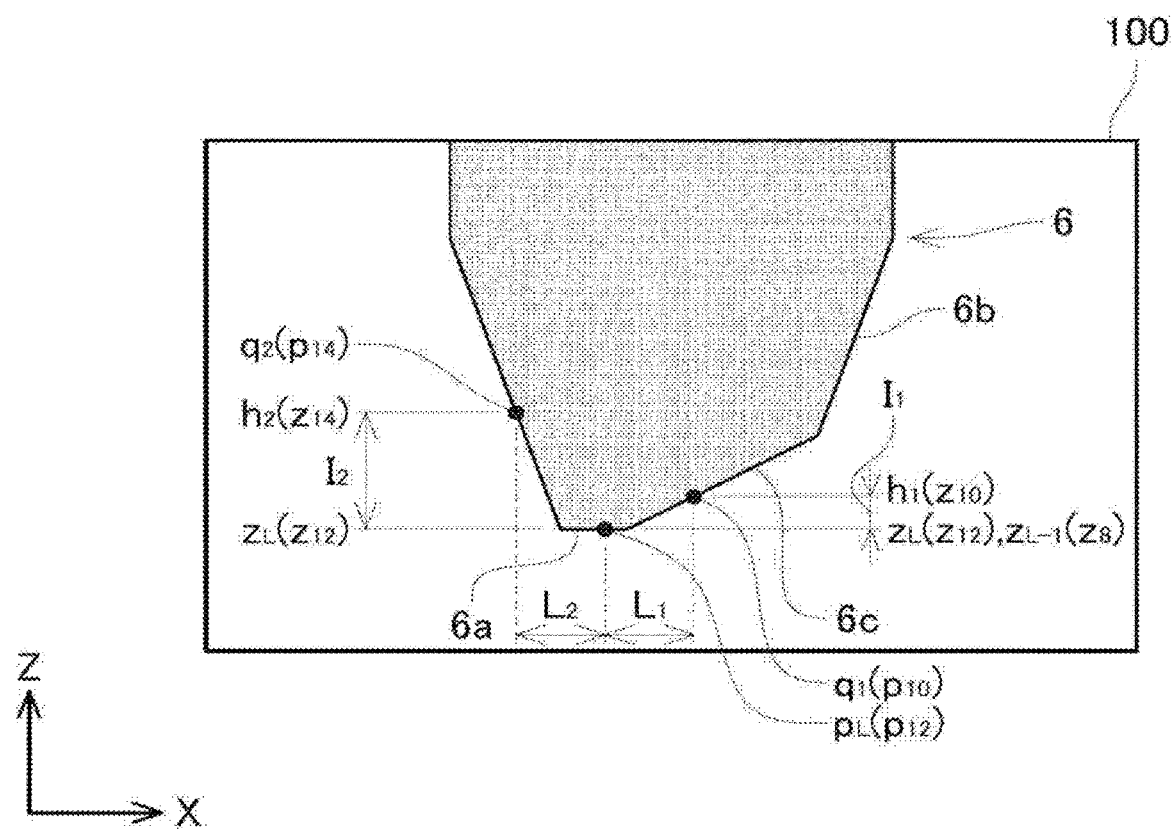
FIG. 10 is nozzle imaged data of a case in which the nozzle suction surface of the suction nozzle is chipped.

In the case of FIG. 9, in Step S18, the control device 30 calculates the positional information $p_{12}$ ($x_{12}$, $z_{12}$) of the first inspection line $C_{12}$ that senses the nozzle suction surface 6a as the positional information $p_L$ ($x_L$, $z_L$) of the lowermost end position $p_L$. Next, in Step S20, the control device 30 calculates a first height $h_1$ and a second height $h_2$. The first height $h_1$ is calculated using the height information $z_{10}$ of the positional information $p_{10}$ at which a nozzle chipped surface 6c is positioned, and the second height $h_2$ is calculated using the height information $z_{14}$ of the positional information $p_{14}$ at which the nozzle side surface 6b is positioned. Additionally, the position of the nozzle chipped surface 6c in the X-direction is included at a position of the nozzle suction surface 6a in the X-direction in a case in which the nozzle suction surface 6a is normal. Next, in Step S22, the control device 30 calculates the first difference $I_1$ and the second difference $I_2$.

Next, in Step S24, the control device 30 calculates first difference $I_1$, which is the smaller of the first difference $I_1$ and the second difference $I_2$, as the determination difference I. There are many cases in which the inclination of the nozzle chipped surface 6c relative to the nozzle suction surface 6a is less than the inclination of the nozzle side surface 6b relative to the nozzle suction surface 6a. As shown in FIG. 10, the first difference $I_1$, which is calculated using the height information $z_{10}$ at which the nozzle chipped surface 6c is positioned, is smaller than the second difference $I_2$, which is calculated using the height information $z_{14}$ at which the nozzle side surface 6b is positioned. Therefore, the first difference $I_1$ is adopted as the determination difference I. As a result of this, it is possible to suitably calculate the size of a chip of the nozzle suction surface 6a.

Next, in Step S26, the control device 30 determines that the determination difference I is the first set value or more, and advances the process to Step S30. A value at which it is possible to detect chipping of the nozzle is set as the first set value. Next, in Step S30, the control device 30 calculates the third difference $I_3$, which is the difference between the height information $z_L$ of the lowermost end position $p_L$ calculated on this occasion and the height information $z_{L-1}$ of the lowermost end position $p_{L-1}$ calculated in a previous determination process. In the case of FIG. 10, the third difference $I_3$ is substantially 0. Next, in Step S32, the control device 30 determines that the third difference $I_3$ is less than the second set value, and advances the process to Step S36. Next, in Step S36, the control device 30 transmits a nozzle chipping determination signal to the operation panel 28. As a result of this, it is possible for an operator to recognize that there is a chip in the nozzle suction surface 6a.

As is evident from the above-mentioned explanation, in the component mounting machine 10 of the first embodiment, the set distance calculation process and the determination process are executed using only the nozzle imaged data 100 imaged on this occasion. That is, in the component mounting machine 10 of the first embodiment, it is possible to determine the quality of the nozzle suction surface 6a of the suction nozzle 6 by using only the nozzle imaged data 100. Therefore, it is not necessary to store nozzle imaged data in the storage device 40 in advance. As a result of this, it is possible to decrease the capacity of various data that is stored in the storage device 40 in advance. In addition, it is possible to suitably determine the quality of the nozzle suction surface 6a by using the smaller difference of the first difference $I_1$ and the second difference $I_2$.

Embodiments according to the technology disclosed in the present description has been described in detail, but these are merely illustrative examples, and do not limit the range of the claims. Embodiments in which the specific examples that are illustrated by way of example above are modified and changed in various manners are also included in the technology that is set forth in the claims.

In the first embodiment, the control device 30 calculates the reference length D. However, the control device 30 may be capable of communicating with an external control device, and may be configured so that the reference length D is input from the external control device.

Figure 11:
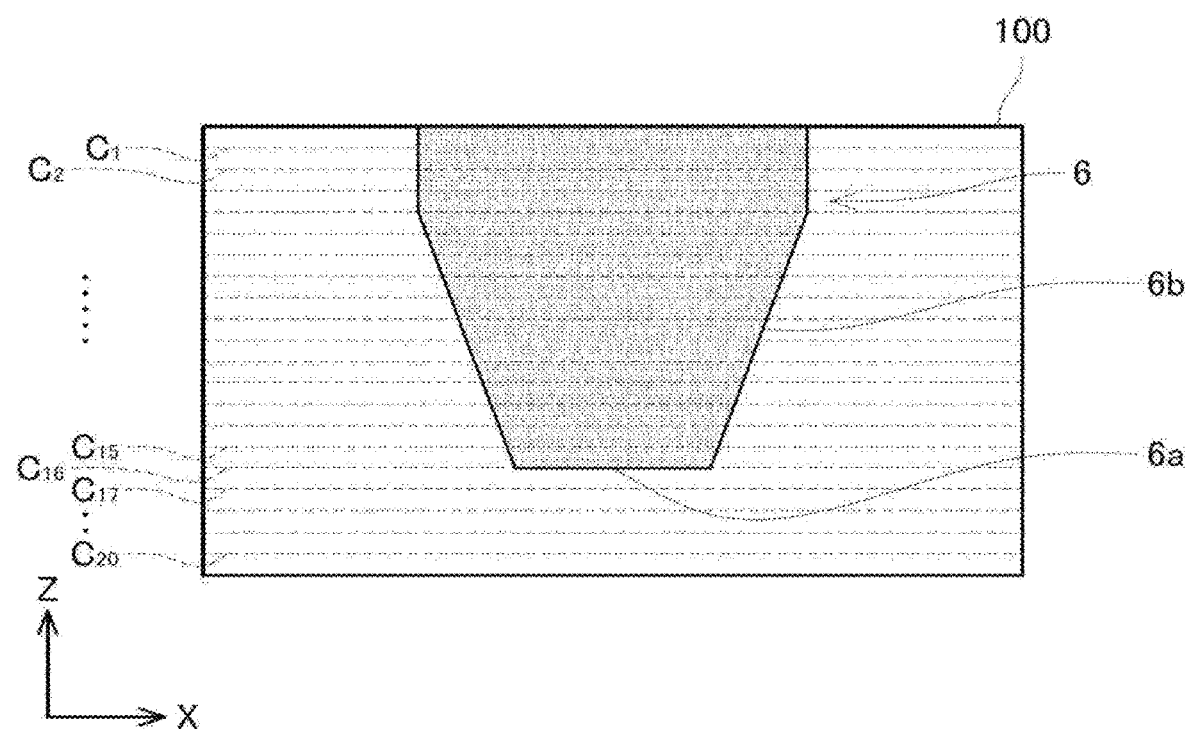
FIG. 11 is a view that shows a state in which multiple first inspection lines that extend in a horizontal direction are set, at an interval in the vertical direction, in the nozzle imaged data of a normal suction nozzle.

In the first embodiment, the multiple first inspection lines C that extend in the vertical direction are set in the nozzle imaged data 100 at an interval in the horizontal direction. However, multiple first inspection lines C that extend in the horizontal direction may be disposed in the nozzle imaged data 100 at an interval in the vertical direction (FIG. 11).

The technical elements described in the present description and drawings exhibit technological effectiveness either individually or in various combinations, and are not limited to the combinations that were set forth in the claims at the time of filing. In addition, the technology illustrated by way of example in the present description and drawings simultaneously achieves multiple objects, and is effective as a result of achieving one among said objects.

The invention claimed is:

1. A component mounting machine configured to mount a component on a board, the machine comprising:
    a suction nozzle that has a nozzle suction surface to which a component is suctioned;
    a camera that is disposed on a lateral side of the suction nozzle and is configured to acquire nozzle imaged data of a tip end of the suction nozzle; and
    a control device configured to determine a quality of the nozzle suction surface of the suction nozzle,
    wherein the nozzle imaged data includes a nozzle region in which the tip end of the suction nozzle is captured, and a background region in which a background below the tip end of the suction nozzle is captured, and
    wherein the control device is configured to calculate a lowermost end position that includes
        scanning a plurality of first inspection lines in a vertical direction or a horizontal direction of the nozzle imaged data, and
        calculating a lowermost end position of the nozzle suction surface or foreign matter adhered to the nozzle suction surface from a plurality of items of positional information obtained by sensing the nozzle suction surface or foreign matter adhered to the nozzle suction surface by using the plurality of first inspection lines,
    calculate a difference that includes
        calculating, on the basis of the plurality of items of positional information, a first height, which is a position in the vertical direction of the nozzle suction surface or foreign matter adhered to the nozzle suction surface at a first position that is separated from the lowermost end position by a first set distance or more on one side in the horizontal direction,
        calculating, on the basis of the plurality of position information, a second height, which is a position in the vertical direction of the nozzle suction surface or foreign matter adhered to the nozzle suction surface at a second position that is separated from the lowermost end position by a second set distance or more on the other side in the horizontal direction, and
        calculating a first difference between the first height and a height of the lowermost end position and a second difference between the second height and the height of the lowermost end position, and
    determine the quality of the nozzle suction surface on the basis of the smaller difference of the first difference and the second difference.

2. The component mounting machine according to claim 1,
    wherein the control device is configured to determine that there is an abnormality of the nozzle suction surface in a case in which the smaller difference is a first set value, which is set in advance, or more.

3. The component mounting machine according to claim 1,
    wherein the first set distance and the second set distance are the same, and
    wherein, in the nozzle imaged data in which the suction nozzle is imaged in a normal state, when a length of the nozzle suction surface in the horizontal direction is defined as a reference length, the first set distance and the second set distance are set to be half or less of the reference length.

4. The component mounting machine according to claim 1,
    wherein the control device includes a memory section that stores a plurality of heights of the lowermost end position,
    wherein the control device is configured to store a calculated height of the lowermost end position in the memory section each time the lowermost end position calculation is performed, and
    wherein when the control device determines that there is an abnormality of the nozzle suction surface, the control device is configured to further determine that the abnormality of the nozzle suction surface is the adherence of foreign matter to the nozzle suction surface when a third difference between a height of the lowermost end position that is calculated in a current lowermost end position calculation process and a height of the lowermost end position that is calculated in an immediately preceding lowermost end position calculation process, which is stored in the memory section, is a second set value, which is set in advance, or more, and determine that the abnormality of the nozzle suction surface is chipping of the nozzle suction surface when the third difference is less than the second set value.

5. The component mounting machine according to claim 1, further comprising:
    a head that supports the suction nozzle and moves with the suction nozzle in an integral manner,
    wherein the control device includes a plurality of control circuits,
    wherein one of the plurality of control circuits is mounted in the head, and
    wherein the control device is configured to calculate the lowermost end position, calculate the difference, and determine the quality of the nozzle suction surface by using the control circuit mounted in the head.

* * * * *